(12) United States Patent
Cui et al.

(10) Patent No.: US 9,059,268 B2
(45) Date of Patent: Jun. 16, 2015

(54) TUNNELING FIELD EFFECT TRANSISTOR AND METHOD FOR FABRICATING THE SAME

(75) Inventors: Ning Cui, Beijing (CN); Renrong Liang, Beijing (CN); Jing Wang, Beijing (CN); Jun Xu, Beijing (CN)

(73) Assignee: Tsinghua University, Beijing (CN)

( * ) Notice: Subject to any disclaimer, the term of this patent is extended or adjusted under 35 U.S.C. 154(b) by 46 days.

(21) Appl. No.: 13/641,116

(22) PCT Filed: Aug. 21, 2012

(86) PCT No.: PCT/CN2012/080408
§ 371 (c)(1),
(2), (4) Date: Oct. 13, 2012

(87) PCT Pub. No.: WO2013/120344
PCT Pub. Date: Aug. 22, 2013

(65) Prior Publication Data
US 2013/0207167 A1    Aug. 15, 2013

(51) Int. Cl.
*H01L 29/78* (2006.01)
*H01L 29/66* (2006.01)
(Continued)

(52) U.S. Cl.
CPC .......... *H01L 29/78* (2013.01); *H01L 29/66477* (2013.01); *H01L 21/26586* (2013.01); *H01L 29/42368* (2013.01); *H01L 29/517* (2013.01); *H01L 29/66356* (2013.01); *H01L 29/7391* (2013.01); *H01L 29/7843* (2013.01); *H01L 29/0649* (2013.01); *H01L 29/0834* (2013.01); *H01L 29/0847* (2013.01)

(58) Field of Classification Search
CPC ................ H01L 29/78; H01L 29/7833; H01L 29/66477; H01L 29/6659

USPC ................................... 438/296, 268; 257/288
See application file for complete search history.

(56) References Cited

U.S. PATENT DOCUMENTS

2006/0091490 A1*  5/2006  Chen et al. ............. 257/458
2008/0185664 A1*  8/2008  Kwon et al. ............ 257/402
(Continued)

FOREIGN PATENT DOCUMENTS

CN            101236986 A    8/2008

OTHER PUBLICATIONS

WIPO, International Search Report and Written Opinion issued on Nov. 29, 2012.
China Patent Office, Office action issued on Oct. 8, 2013.

*Primary Examiner* — Christine Enad
(74) *Attorney, Agent, or Firm* — Houtteman Law LLC

(57) ABSTRACT

A tunneling field effect transistor and a method for fabricating the same are provided. The tunneling field effect transistor comprises: a semiconductor substrate; a channel region formed in the semiconductor substrate, with one or more isolation structures formed in the channel region; a first buried layer and a second buried layer formed in the semiconductor substrate and located at both sides of the channel region respectively, the first buried layer being first type non-heavily-doped, and the second buried layer being second type non-heavily-doped; a source region and a drain region formed in the semiconductor substrate and located on the first buried layer and the second buried layer respectively; and a gate dielectric layer formed on the one or more isolation structures, and a gate formed on the gate dielectric layer.

15 Claims, 5 Drawing Sheets

(51) Int. Cl.
*H01L 21/265* (2006.01)
*H01L 29/739* (2006.01)
*H01L 29/06* (2006.01)
*H01L 29/08* (2006.01)
*H01L 29/423* (2006.01)
*H01L 29/51* (2006.01)

(56) References Cited

U.S. PATENT DOCUMENTS

2010/0059737 A1* 3/2010 Bhuwalka et al. ............ 257/28
2010/0200916 A1* 8/2010 Gossner et al. ............. 257/335
2011/0147838 A1* 6/2011 Gossner et al. ............. 257/345

* cited by examiner

TUNNELING FIELD EFFECT TRANSISTOR AND METHOD FOR FABRICATING THE SAME

CROSS-REFERENCE TO RELATED APPLICATION

This application claims priority to and benefits of Chinese Patent Application Serial No. 201210034358.7, filed with the State Intellectual Property Office of P. R. China on Feb. 15, 2012, the entire contents of which are incorporated herein by reference.

FIELD

The present disclosure relates to semiconductor design and fabrication field, and more particularly to a tunneling field effect transistor (TFET) and a method for fabricating the same.

BACKGROUND

For a MOSFET (metal-oxide-semiconductor field-effect transistor) integrated circuit, an off-state leakage current may be quickly increased with a scaling down of a feature size of the integrated circuit. In order to further reduce a power consumption of a device and improve a voltage-withstanding capability, a tunneling field effect transistor having a work principle different from MOSFET is widely used. Currently, a drain and a source of a conventional tunneling field effect transistor are located in a same plane of a semiconductor substrate. The tunneling field effect transistor with such a structure has a poor high-voltage-withstanding capability, a large on-state resistance and a high power consumption. Therefore, how to improve the voltage-withstanding capability of the tunneling field effect transistor and to reduce the power consumption is one of technical problems that urgently need to be solved during a process of researching and developing the tunneling field effect transistor.

SUMMARY

The present disclosure is aimed to solve at least one of the defects, particularly defects of poor high-voltage-withstanding capability, large on-state resistance and high power consumption of a conventional tunneling field effect transistor.

According to an aspect of the present disclosure, a tunneling field effect transistor is provided. The tunneling field effect transistor comprises: a semiconductor substrate; a channel region formed in the semiconductor substrate, with one or more isolation structures formed in the channel region; a first buried layer and a second buried layer formed in the semiconductor substrate and located at both sides of the channel region respectively, in which the first buried layer is first type non-heavily-doped, and the second buried layer is second type non-heavily-doped; a source region and a drain region formed in the semiconductor substrate and located on the first buried layer and the second buried layer respectively, in which the source region is first type heavily doped, and the drain region is second type heavily doped; and a gate dielectric layer formed on the one or more isolation structures, and a gate formed on the gate dielectric layer.

In one embodiment, a dielectric material is filled in the one or more isolation structures to produce a stress in the channel region, enhance a carrier mobility in the channel region, and reduce an on-state resistance of the channel region.

In one embodiment, the semiconductor substrate is lightly doped or intrinsic, thus decreasing an on-state resistance of a device and reducing a power consumption under a large current.

In one embodiment, a source region metal layer is formed on the source region, and a drain region metal layer is formed on the drain region.

In one embodiment, a material of each of the source region metal layer and the drain region metal layer is a metal-semiconductor alloy.

In one embodiment, an isolation layer is formed at both sides of each of the gate dielectric layer and the gate.

In one embodiment, a passivation layer is formed on the source region metal layer, the drain region metal layer and the gate, and a plurality of contact holes are formed in the passivation layer and penetrate through the passivation layer to the source region metal layer, the drain region metal layer and the gate respectively.

In one embodiment, a plurality of metallic interconnections are formed on the passivation layer and connected with the source region metal layer, the drain region metal layer and the gate via the plurality of contact holes respectively.

According to another aspect of the present disclosure, a method for fabricating a tunneling field effect transistor is provided. The method comprises steps of: S1: providing a semiconductor substrate; S2: forming one or more trenches in the semiconductor substrate; S3: filling a dielectric material in the one or more trenches to form one or more isolation structures; S4: forming a gate dielectric layer on the one or more isolation structures, and forming a gate on the gate dielectric layer, in which a region of the semiconductor substrate covered by the gate dielectric layer is a channel region; S5: performing a first type non-heavy-doping for a first external region of the semiconductor substrate outside the channel region to form a first buried layer; S6: performing a second type non-heavy-doping for a second external region the semiconductor substrate outside the channel region to form a second buried layer; S7: performing a first type heavy doping for a surface region of the first buried layer to form a source region; and S8: performing a second type heavy doping for a surface region of the second buried layer to form a drain region.

In one embodiment, the semiconductor substrate is lightly doped or intrinsic, thus decreasing an on-state resistance of a device and reducing a power consumption under a large current.

In one embodiment, the dielectric material filled in the one or more isolation structures produces a stress in the channel region, thus enhancing a carrier mobility in the channel region, and reducing an on-state resistance of the channel region. The dielectric material filled in the one or more isolation structures may comprise: silicon oxide, silicon nitride, etc.

In one embodiment, after the step S6, the method further comprises: forming an isolation layer at both sides of each of the gate dielectric layer and the gate.

In one embodiment, after the step S8, the method further comprises: S9: forming a source region metal layer on the source region, and forming a drain region metal layer on the drain region.

In one embodiment, a material of each of the source region metal layer and the drain region metal layer is a metal-semiconductor alloy.

In one embodiment, after the step S9, the method further comprises: S10: forming a passivation layer on the source region metal layer, the drain region metal layer and the gate, and forming a plurality of contact holes in the passivation layer, in which the plurality of contact holes penetrate through the passivation layer to the source region metal layer, the drain region metal layer and the gate respectively; and S11: forming a plurality of metallic interconnections on the passivation layer, in which the plurality of metallic interconnections are connected with the source region metal layer, the drain region metal layer and the gate via the plurality of contact holes respectively.

With the tunneling field effect transistor and the method for fabricating the same according to embodiments of the present disclosure, by disposing the one or more isolation structures in the active region of the substrate to increase the surface area of the channel region, which is equivalent to increasing the length of the channel region, the high-voltage-withstanding capability of the tunneling field effect transistor may be enhanced. In addition, by forming non-heavily-doped regions (i.e., the first buried layer and the second buried layer) with opposite doping types near the source region and the drain region respectively, the voltage-withstanding capability of the device in the off state may be improved. However, because of the effect of the gate voltage in the on state, the electron accumulation or the electron inversion may be formed on the surface of the device, so that the two regions (i.e., the first buried layer and the second buried layer) may not influence on-state characteristics of the device.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
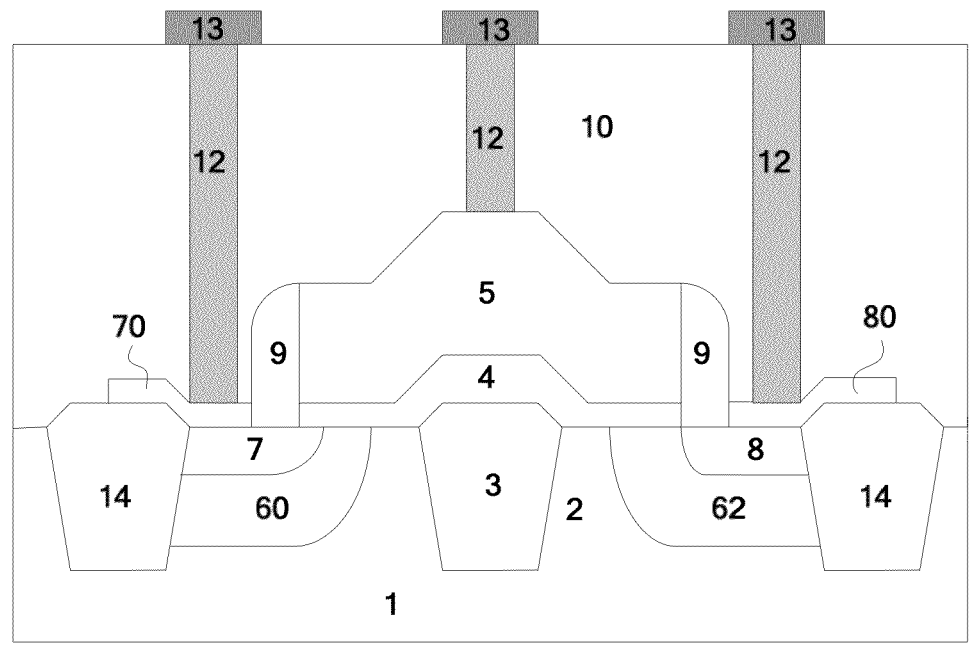
FIG. 1 is a schematic cross-sectional view of a tunneling field effect transistor according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

In addition, terms such as "first" and "second" are used herein for purposes of description and are not intended to indicate or imply relative importance or significance or imply a number of technical features indicated. Therefore, a "first" or "second" feature may explicitly or implicitly comprise one or more features. Further, in the description, unless indicated otherwise, "a plurality of" refers to two or more.

FIG. 1 is a schematic cross-sectional view of a tunneling field effect transistor according to an embodiment of the present disclosure. It should be noted that, the tunneling field effect transistor according to an embodiment of the present disclosure may be an n-type or p-type tunneling field effect transistor. For conciseness purpose, only the n-type tunneling field effect transistor will be taken as an example to describe the present disclosure. For the p-type tunneling field effect transistor, a doping type may be correspondingly changed with reference to the n-type tunneling field effect transistor according to an embodiment of the present disclosure.

As shown in FIG. 1, the tunneling field effect transistor comprises: a semiconductor substrate 1; a channel region 2 formed in the semiconductor substrate 1, with one or more isolation structures 3 formed in the channel region 2; a first buried layer 60 and a second buried layer 62 formed in the semiconductor substrate 1 and located at both sides of the channel region 2 respectively, in which the first buried layer 60 is first type non-heavily-doped, and the second buried layer 62 is second type non-heavily-doped; a source region 7 and a drain region 8 formed in the semiconductor substrate 1 and located on the first buried layer 60 and the second buried layer 62 respectively, in which the source region 7 is first type heavily doped, and the drain region 8 is second type heavily doped; and a gate dielectric layer 4 formed on the one or more isolation structures 3, and a gate 5 formed on the gate dielectric layer 4.

As shown in FIG. 1, the tunneling field effect transistor comprises the semiconductor substrate 1. A material of the semiconductor substrate 1 may be any semiconductor substrate material used for fabricating a tunneling field effect transistor, specifically may be, but is not limited to, semiconductor materials such as Si (silicon), SiGe (silicon germanium), Ge (germanium) or GaAs (gallium arsenide). In this embodiment, the semiconductor substrate 1 is n-type lightly doped or intrinsic, which may decrease an on-state resistance of a device and reduce a power consumption under a large current.

The channel region 2 is formed in the semiconductor substrate 1, and the one or more isolation structures 3 are formed in the channel region 2. It should be noted that, for conciseness purpose, only one isolation structure 3 is shown in the drawings as an example. By disposing the isolation structures in an active region (i.e., the channel region 2) of the semiconductor substrate 1 to increase a surface area of the channel region, which is equivalent to increasing a length of the channel region, a high-voltage-withstanding capability of the tunneling field effect transistor may be enhanced. In a preferred embodiment, a dielectric material such as silicon oxide or silicon nitride, which can produce a stress in the channel region 2, is filled in the isolation structures 3. By introducing the dielectric material in the isolation structures 3, a tensile stress may be produced in a channel region of an n-type TFET, or a compressive stress may be produced in a channel region of a p-type TFET, so as to enhance a carrier mobility in the channel region and reduce the on-state resistance of the channel region.

The source region 7 and the drain region 8 are formed in the semiconductor substrate 1 and at both sides of the channel region 2 respectively. The source region 7 is p-type heavily doped, and the drain region 8 is n-type heavily doped. The first buried layer 60 and the second buried layer 62 are formed in the semiconductor substrate 1, located at both sides of the channel region 2 and approaching to the source region 7 and the drain region 8 respectively. In this embodiment, the first buried layer 60 is p-type non-heavily-doped, and the second buried layer 62 is n-type non-heavily-doped. By forming non-heavily-doped regions (i.e., the first buried layer 60 and the second buried layer 62) with opposite doping types near the source region 7 and the drain region 8 respectively, the breakdown-withstanding capability of the device in an off state may be improved. However, because of an effect of a gate voltage in an on state, an electron accumulation or an electron inversion may be formed on a surface of the device, so that the two regions (i.e., the first buried layer 60 and the second buried layer 62) may not influence on-state characteristics of the device.

A gate dielectric layer 4 is formed on the isolation structure 3. A material of the gate dielectric layer 4 may be any gate dielectric material used for fabricating a tunneling field effect transistor, specifically may be, is not limited to, a high k dielectric, $SiO_2$ (silicon dioxide), or a material with a work function adjusting function. In this embodiment, the gate dielectric layer 4 may be a work function tuning layer which can adjust the work function of the substrate. For an n-type substrate, a material of the work function tuning layer may be, but is not limited to, $HfO_2$ (hafnium oxide). For a p-type substrate, a material of the work function tuning layer may be, but is not limited to, a compound of Al. The gate 5 is formed on the gate dielectric layer 4. In this embodiment, the gate 5 may be, but is not limited to, a poly-silicon gate or a metal gate.

In this embodiment, a shallow trench isolation (STI) structure 14 is formed in the semiconductor substrate 1 and between different active regions. A source region metal layer 70 is formed on the source region 7, and a drain region metal layer 80 is formed on the drain region 8. A material of each of the source region metal layer 70 and the drain region metal layer 80 may be a metal-semiconductor alloy or a metal silicide. An isolation layer 9 (i.e., a side wall) is formed at both sides of each of the gate dielectric layer 4 and the gate 5. A passivation layer 10 is formed on the source region metal layer 70, the drain region metal layer 80 and the gate 5, and a plurality of contact holes 12 are formed in the passivation layer 10 and penetrate through the passivation layer 10 to the source region metal layer 70, the drain region metal layer 80 and the gate 5 respectively. A plurality of metallic interconnections 13 are formed on the passivation layer 10 and connected with the source region metal layer 70, the drain region metal layer 80 and the gate 5 via the plurality of contact holes 12 respectively.

A method for fabricating the n-type tunneling field effect transistor according to an embodiment of the present disclosure will be described in detail below with reference to FIGS. 2-11. The method comprises following steps.

In step S1, a semiconductor substrate 1 is provided. A material of the semiconductor substrate 1 may be any semiconductor substrate material used for fabricating a tunneling field effect transistor, specifically may be, but is not limited to, semiconductor materials such as Si, SiGe, Ge or GaAs. In this embodiment, the semiconductor substrate 1 is n-type lightly doped or intrinsic, which may decrease an on-state resistance of a device and reduce a power consumption under a large current.

Figure 2:
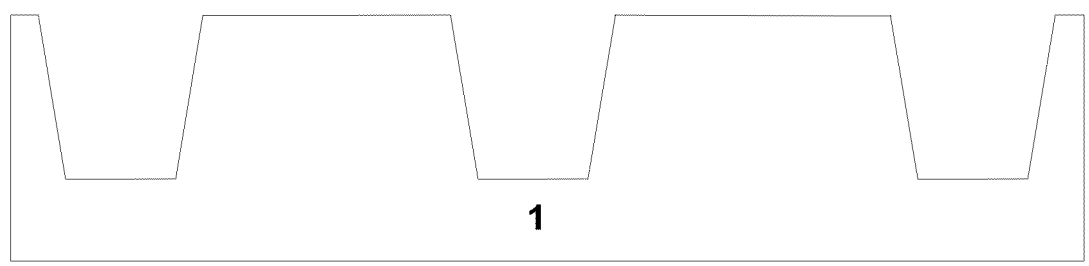
FIGS. 2-11 are schematic cross-sectional views of intermediate statuses of a tunneling field effect transistor formed in steps of a method for fabricating a tunneling field effect transistor according to an embodiment of the present disclosure.

In step S2, one or more trenches are formed in the semiconductor substrate 1. Specifically, the semiconductor substrate 1 may be etched to form the one or more trenches, as shown in FIG. 2.

Figure 3:
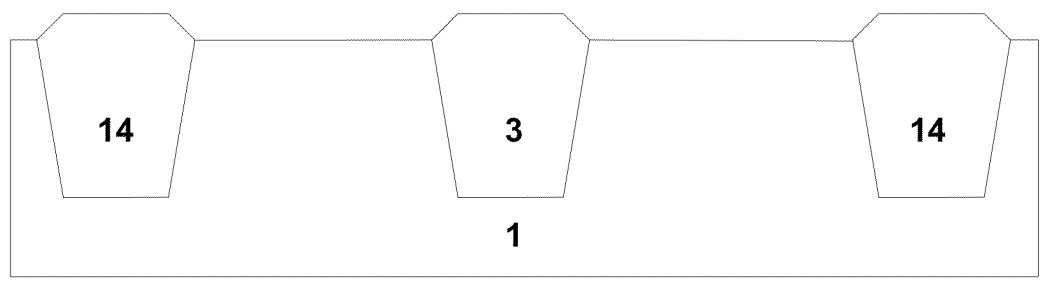

In step S3, a dielectric material is filled in the one or more trenches to form one or more isolation structures. In this embodiment, the dielectric material such as silicon oxide or silicon nitride may be filled in the trenches. The dielectric material, in one aspect may play a role of isolation, and in another aspect may introduce a stress in the channel region to enhance a carrier mobility in the channel region and to reduce an on-state resistance of the channel region. A method for filling the dielectric material may be a conventional dielectric depositing method, such as chemical vapor deposition (CVD), physical vapor deposition (PVD), pulse laser deposition (PLD), atomic layer deposition (ALD), plasma enhanced atomic layer deposition (PEALD) or other processes. Then, an annealing is performed to form the isolation structures. In this embodiment, the isolation structures 3 in an active region and a conventional STI structure 14 for isolating different active regions may be formed simultaneously in this step, that is, an isolation structure located in the middle of the semiconductor substrate 1 is the isolation structure 3 in the active region, and two isolation structures located at both sides of the semiconductor substrate 1 are the STI structures 14 for isolating the different active regions, as shown in FIG. 3.

Figure 4:
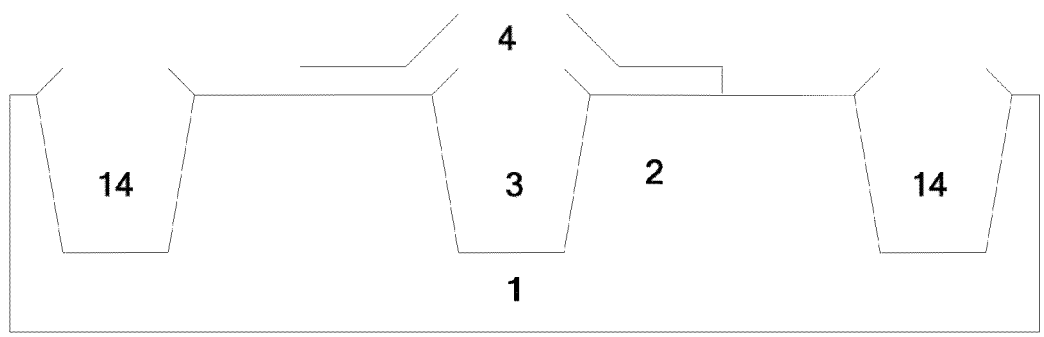
Figure 5:
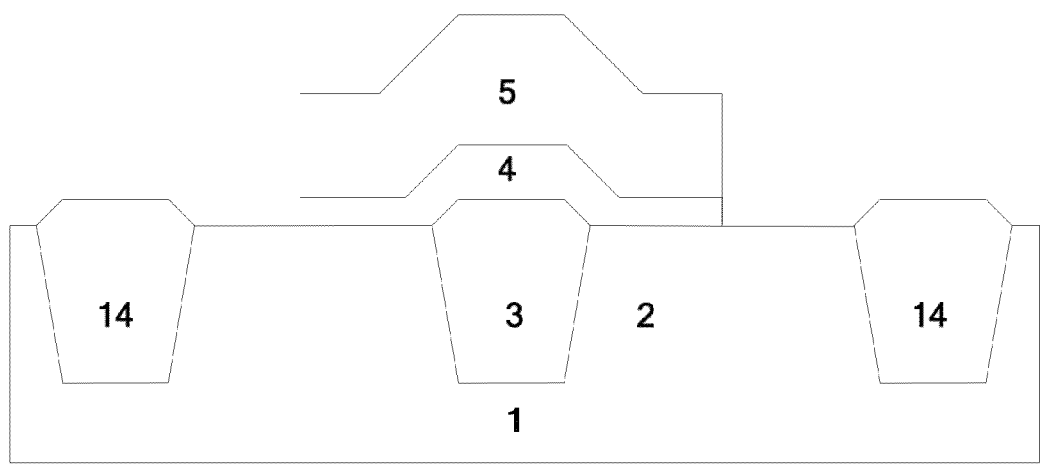

In step S4, a gate stack is formed on the one or more isolation structures 3. The gate stack comprises a gate dielectric layer 4 and a gate 5 located on the gate dielectric layer 4. A region of the semiconductor substrate 1 covered by the gate stack is a channel region 2. The step of forming the gate stack is substantially a step of defining the channel region 2. It should be noted that, for conciseness purpose, only one isolation structure 3 is shown in the drawings as an example. Specifically, the gate dielectric layer 4 may be formed by first depositing a gate dielectric material and then coating a photoresist, performing a photolithography, etching and removing the photoresist, as shown in FIG. 4. In this embodiment, a material of the gate dielectric layer 4 may be, but is not limited to, $SiO_2$ or a high k dielectric such as $HfO_2$. The gate 5 may be formed by depositing a gate material, including, but not limited to, poly-silicon or a metal, on the gate dielectric layer 4; and then coating a photoresist, performing a photolithography, etching and removing the photoresist, as shown in FIG. 5.

Figure 6:
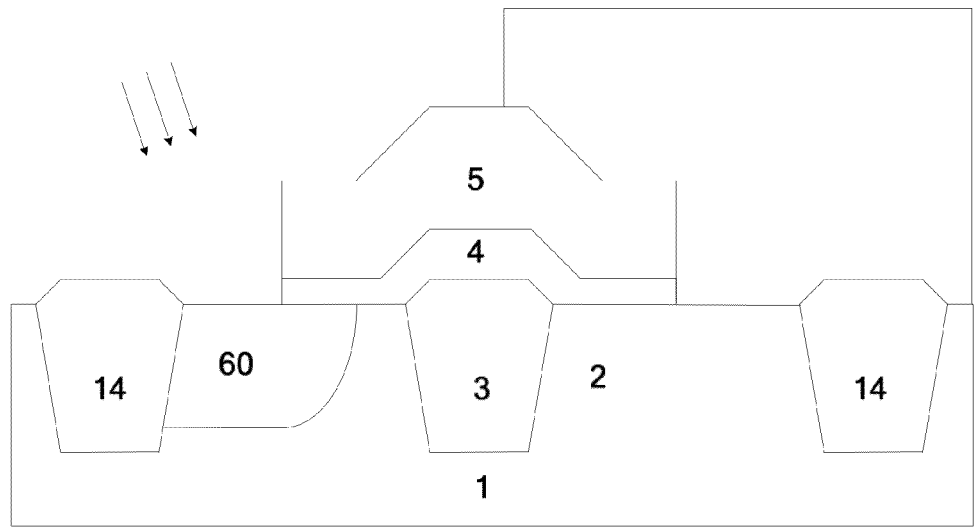

In step S5, a first type non-heavy-doping is performed for a first external region of the semiconductor substrate 1 outside the channel region 2 to form a first buried layer 60. Specifically, the first buried layer 60 may be formed by forming a patterned mask on a surface of a device by photolithography, in which the patterned mask covers a second surface region (i.e., a region adjacent to the drain region) of the channel region 2 using the gate 5 as a self-aligned boundary; performing an ion implantation for a first surface region (i.e., a region adjacent to the source region) of the channel region 2, where the implantation type may be p-type; and then annealing, as shown in FIG. 6. In this embodiment, the first buried layer 60 is non-heavily-doped.

Figure 7:
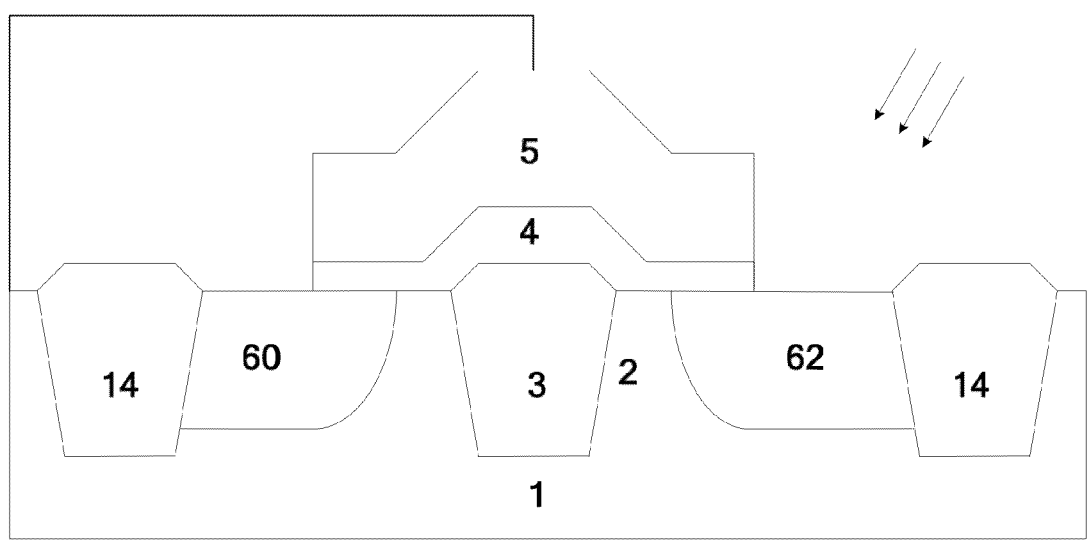

In step S6, a second type non-heavy-doping is performed for a second external region of the semiconductor substrate 1 outside the channel region 2 to form a second buried layer 62. Specifically, the second buried layer 62 may be formed by forming a patterned mask on the surface of the device by photolithography, in which the patterned mask covers the first surface region (i.e., the region adjacent to the source region) of the channel region 2 using the gate 5 as a self-aligned boundary; performing an ion implantation for the second surface region (i.e., the region adjacent to the drain region) of the channel region 2, where the implantation type may be n-type; and then annealing, as shown in FIG. 7. In this embodiment, the second buried layer 62 is non-heavily-doped.

Figure 8:
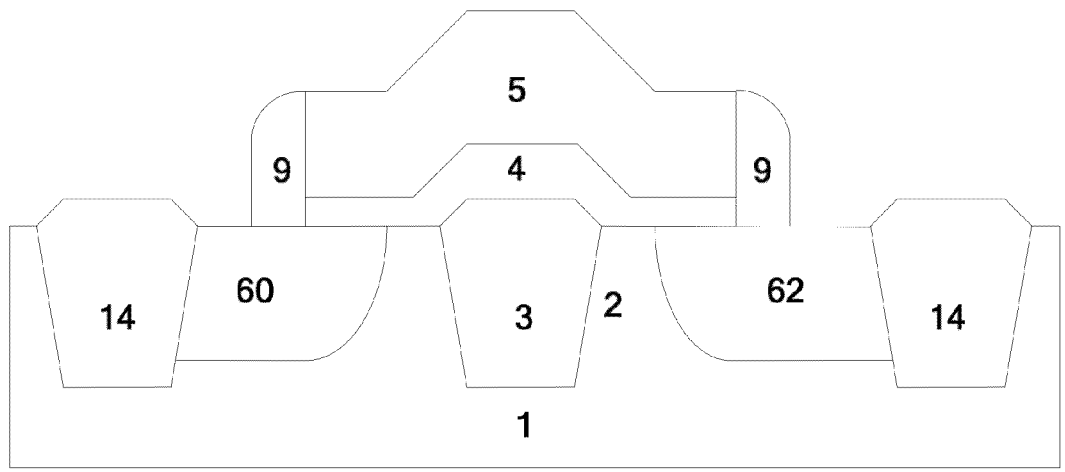

In this embodiment, after the step S6, the method further comprises: forming an isolation layer 9 (i.e., a side wall) at both sides of the gate stack. Specifically, the isolation layer 9 may be formed at both sides of the gate stack by depositing a protection dielectric such as silicon oxide or silicon nitride and then dry etching, as shown in FIG. 8.

Figure 9:
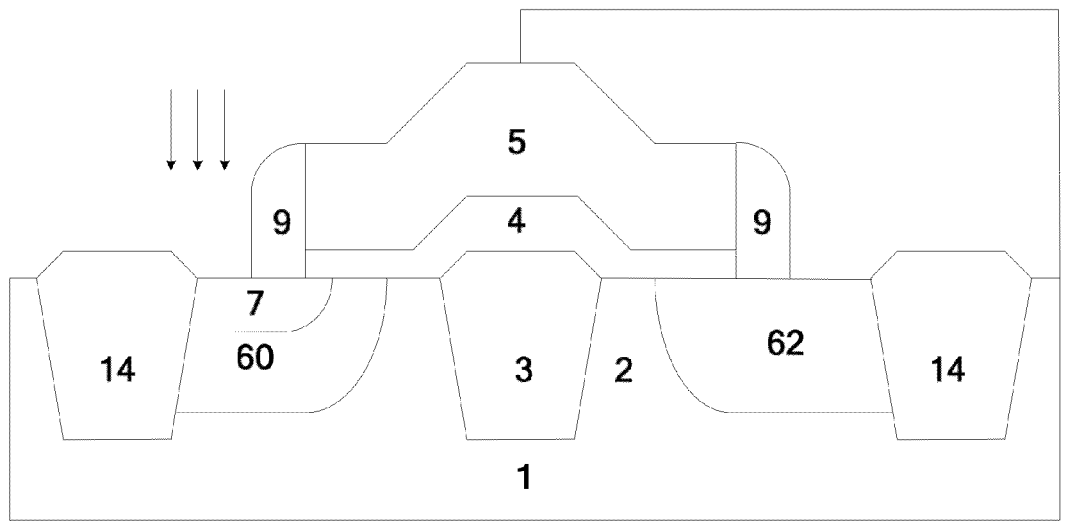

In step S7, a first type heavy doping is performed for a surface region of the first buried layer 60 to form the source region 7. Specifically, the source region 7 may be formed by forming a patterned mask on the surface of the device by photolithography, in which the patterned mask covers a surface region of the second buried layer 62 using the isolation layer 9 as a self-aligned boundary; performing an ion implantation for the surface region of the first buried layer 60, where the implantation type may be p-type; and then annealing, as shown in FIG. 9. In this embodiment, the source region 7 is heavily-doped.

Figure 10:
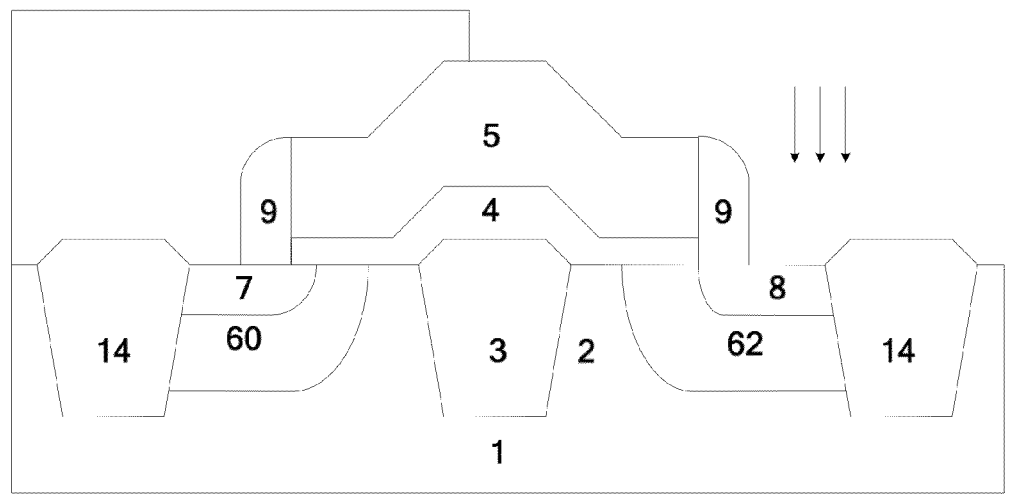

In step S8, a second type heavy doping is performed for the surface region of the second buried layer 60 to form the drain region 8. Specifically, the drain region 8 may be formed by forming a patterned mask on the surface of the device by photolithography, in which the patterned mask covers the surface region of the first buried layer 60 using the isolation layer 9 as a self-aligned boundary; performing an ion implantation for the surface region of the second buried layer 62, where the implantation type may be n-type; and then annealing, as shown in FIG. 10. In this embodiment, the drain region 8 is heavily-doped.

In this embodiment, after the step S8, the method may further comprise following steps.

Figure 11:
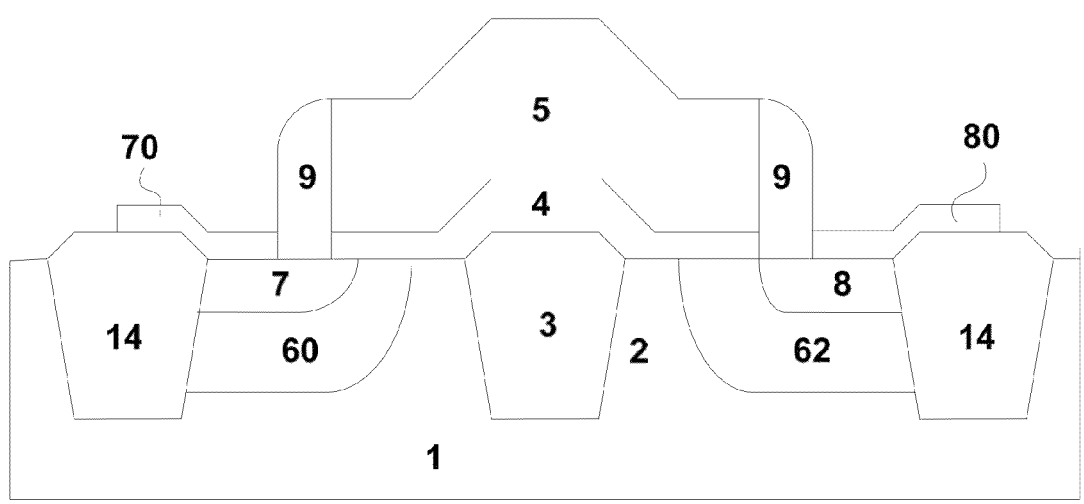

In step S9, a source region metal layer 70 is formed on the source region 7, and a drain region metal layer 80 is formed on the drain region 8. An ohmic contact is formed between the source region metal layer 70 and the source region 7, and an ohmic contact is formed between the drain region metal layer 80 and the drain region 8. A material of each of the source region metal layer 70 and the drain region metal layer 80 may be, but is not limited to, a metal silicide or a metal-semiconductor alloy, as shown in FIG. 11.

In step S10, a passivation layer 10 is formed on the source region metal layer 70, the drain region metal layer 80 and the gate 5, and then a plurality of contact holes 12 are formed in the passivation layer by photolithography and etching. The plurality of contact holes 12 penetrate through the passivation layer 10 to the source region metal layer 70, the drain region metal layer 80 and the gate 5 respectively.

In step S11, a plurality of metallic interconnections 13 are formed on the passivation layer 10. The plurality of metallic interconnections 13 are connected with the source region metal layer 70, the drain region metal layer 80 and the gate 5 via the plurality of contact holes 12 respectively, as shown in FIG. 1.

With the tunneling field effect transistor and the method for fabricating the same according to embodiments of the present disclosure, by disposing the one or more isolation structures in the active region of the substrate to increase the surface area of the channel region, which is equivalent to increasing the length of the channel region, the high-voltage-withstanding capability of the tunneling field effect transistor may be enhanced. In addition, by forming non-heavily-doped regions (i.e., the first buried layer and the second buried layer) with opposite doping types near the source region and the drain region respectively, the voltage-withstanding capability of the device in the off state may be improved. However, because of the effect of the gate voltage in the on state, the electron accumulation or the electron inversion may be formed on the surface of the device, so that the two regions (i.e., the first buried layer and the second buried layer) may not influence on-state characteristics of the device.

Reference throughout this specification to "an embodiment", "some embodiments", "one embodiment", "an example", "a specific examples", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "an example", "a specific examples", or "some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A tunneling field effect transistor, comprising:
   a semiconductor substrate;
   a channel region formed in the semiconductor substrate, with one or more isolation structures formed in the channel region;
   a first buried layer and a second buried layer formed in the semiconductor substrate and located at both sides of the channel region respectively, wherein the first buried layer is first type non-heavily-doped, and the second buried layer is second type non-heavily-doped;
   a source region and a drain region formed in the semiconductor substrate and located on the first buried layer and the second buried layer respectively, wherein the source region is first type heavily doped, and the drain region is second type heavily doped; and
   a gate dielectric layer formed on the one or more isolation structures, and a gate formed on the gate dielectric layer.

2. The tunneling field effect transistor according to claim 1, wherein a dielectric material is filled in the one or more isolation structures to produce a stress in the channel region.

3. The tunneling field effect transistor according to claim 1, wherein the semiconductor substrate is lightly doped or intrinsic.

4. The tunneling field effect transistor according to claim 1, wherein a source region metal layer is formed on the source region, and a drain region metal layer is formed on the drain region.

5. The tunneling field effect transistor according to claim 4, wherein a material of each of the source region metal layer and the drain region metal layer is a metal-semiconductor alloy.

6. The tunneling field effect transistor according to claim 4, wherein a passivation layer is formed on the source region metal layer, the drain region metal layer and the gate, and a plurality of contact holes are formed in the passivation layer and penetrate through the passivation layer to the source region metal layer, the drain region metal layer and the gate respectively.

7. The tunneling field effect transistor according to claim 6, wherein a plurality of metallic interconnections are formed on the passivation layer and connected with the source region metal layer, the drain region metal layer and the gate via the plurality of contact holes respectively.

8. The tunneling field effect transistor according to claim 1, wherein an isolation layer is formed at both sides of each of the gate dielectric layer and the gate.

9. A method for fabricating a tunneling field effect transistor, comprising steps of:
   S1: providing a semiconductor substrate;
   S2: forming one or more trenches in the semiconductor substrate;

S3: filling a dielectric material in the one or more trenches to form one or more isolation structures;

S4: forming a gate dielectric layer on the one or more isolation structures, and forming a gate on the gate dielectric layer, wherein a region of the semiconductor substrate covered by the gate dielectric layer is a channel region;

S5: performing a first type non-heavy-doping for a first external region of the semiconductor substrate outside the channel region to form a first buried layer;

S6: performing a second type non-heavy-doping for a second external region the semiconductor substrate outside the channel region to form a second buried layer;

S7: performing a first type heavy doping for a surface region of the first buried layer to form a source region; and S8: performing a second type heavy doping for a surface region of the second buried layer to form a drain region.

10. The method according to claim 9, wherein the semiconductor substrate is lightly doped or intrinsic.

11. The method according to claim 9, wherein the dielectric material filled in the one or more trenches produces a stress in the channel region.

12. The method according to claim 9, after the step S6, further comprising: forming an isolation layer at both sides of each of the gate dielectric layer and the gate.

13. The method according to claim 9, after the step S8, further comprising:

S9: forming a source region metal layer on the source region, and forming a drain region metal layer on the drain region.

14. The method according to claim 13, wherein a material of each of the source region metal layer and the drain region metal layer is a metal-semiconductor alloy.

15. The method according to claim 13, after the step S9, further comprising:

S10: forming a passivation layer on the source region metal layer, the drain region metal layer and the gate, and forming a plurality of contact holes in the passivation layer, wherein the plurality of contact holes penetrate through the passivation layer to the source region metal layer, the drain region metal layer and the gate respectively; and S11: forming a plurality of metallic interconnections on the passivation layer, wherein the plurality of metallic interconnections are connected with the source region metal layer, the drain region metal layer and the gate via the plurality of contact holes respectively.

\* \* \* \* \*